(12) United States Patent
Wu

(10) Patent No.: US 11,171,196 B2
(45) Date of Patent: Nov. 9, 2021

(54) DISPLAY PANEL

(71) Applicant: Wuhan China Star Optoelectronics Semiconductor Display Technology Co., Ltd., Wuhan (CN)

(72) Inventor: Junjie Wu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 51 days.

(21) Appl. No.: 16/631,471

(22) PCT Filed: Feb. 22, 2019

(86) PCT No.: PCT/CN2019/075964
§ 371 (c)(1),
(2) Date: Jan. 16, 2020

(87) PCT Pub. No.: WO2020/155239
PCT Pub. Date: Aug. 6, 2020

(65) Prior Publication Data
US 2021/0225983 A1    Jul. 22, 2021

(30) Foreign Application Priority Data
Jan. 28, 2019   (CN) .......................... 201910082019.8

(51) Int. Cl.
*H01L 27/32*    (2006.01)
(52) U.S. Cl.
CPC ...... *H01L 27/3276* (2013.01); *H01L 27/3262* (2013.01)

(58) Field of Classification Search
CPC .......................... H01L 27/3276; H01L 27/3262
USPC ............................................................ 257/40
See application file for complete search history.

(56) References Cited

U.S. PATENT DOCUMENTS

| 2006/0255726 | A1* | 11/2006 | Kim ..................... | H01L 27/3279 313/506 |
| 2008/0197778 | A1* | 8/2008 | Kubota ............... | H01L 51/5228 315/73 |
| 2019/0157377 | A1* | 5/2019 | Zeng ................... | H01L 51/5221 |

OTHER PUBLICATIONS

English Machine Translation of CN107887421 (Year: 2018).*

* cited by examiner

*Primary Examiner* — Dzung Tran

(57) ABSTRACT

The present invention provides a display panel including a base substrate, a plurality of pixel units, and a power signal structure. A display area of the display panel includes a lower display area, a middle display area, and an upper display area. The power signal structure includes a VDD power cable, a plurality of VDD signal lines, and a VDD lead-in portion. The VDD lead-in portion is electrically connected to each of the VDD signal lines through holes provided in an insulated layer in the middle display area. Therefore, the VDD power signals provided by a driving chip are introduced from the middle display area, and then transmitted from the middle display area to each of the pixel units by the VDD signal lines, which can effectively reduce the VDD voltage drop in an organic light emitting diode (OLED) panel, thereby significantly improving brightness uniformity of the OLED panel.

9 Claims, 5 Drawing Sheets

DISPLAY PANEL

RELATED APPLICATIONS

This application is a National Phase of PCT Patent Application No. PCT/CN2019/075964 having International filing date of Feb. 22, 2019, which claims the benefit of priority of Chinese Patent Application No. 201910082019.8 filed on Jan. 28, 2019. The contents of the above applications are all incorporated by reference as if fully set forth herein in their entirety.

FIELD AND BACKGROUND OF THE INVENTION

The present invention relates to the field of display technologies, and in particular, to a display panel.

Organic light emitting diode (OLED) displays have advantages such as being self-luminous, low driving voltage, high luminous efficiency, short response time, high definition, and a high contrast ratio, a nearly 180° viewing angle, a wide temperature use range, flexible display, full-color display, and the like, which have aroused great interest in the scientific research and the industry, and are recognized by the industry as the most promising display devices.

An OLED display panel provides a power signal required for normal operation to the OLED device through a power supply line to realize the screen display. The OLED display panel usually needs to form various traces in a frame area, such as a VDD power supply trace and a VSS power supply trace, to supply a high voltage and a low voltage to pixel units. Referring to FIG. 1, it is a schematic diagram of a power configuration structure of a conventional OLED display panel. In the conventional OLED power supply configuration, as shown in the figure, the middle portion of the display panel is a display area, and the pixel units arranged in a matrix are arranged in the display area, and a driving chip (IC) 10 disposed on a lower side of the display area is connected to a VDD power supply line 15 outside the display area. A plurality of longitudinal VDD signal lines 16 disposed in the display area are connected to the VDD power supply line 15 on the lower side of the display area. That is, a path is formed between the driving IC 10, the VDD power supply line 15, and the VDD signal lines 16, and the driving IC 10 provides a power supply voltage VDD to each pixel units through a plurality of VDD signal lines 16, which are disposed between the pixel units and electrically connected to the pixel units.

However, due to resistance of the VDD signal lines 16 itself, when the VDD supply voltage is transmitted from a side near the drive IC 10 to another side away the drive IC 10, the loss on the VDD signal lines 16 causes a significant ohmic voltage drop across the VDD signal lines 16 (IR drop). The larger voltage drop results in a difference in the VDD voltage signals of the different pixel units, so that when turning on, brightness of the display panel is: an upper portion of the display area, which is away from the driving IC 10, is darker than a lower portion of the display area, which is near the driving IC 10. In the existing small-sized panel structure, because the driving IC is only disposed on one side edge of the display panel, this fundamentally causes the display panel to have asymmetric brightness and poor brightness uniformity.

The brightness uniformity of the display screen is an important indicator for judging whether the display is good or not. The brightness unevenness is reflected on the screen, which will cause a large difference between the brightness and the darkness of the screen. Our eyes consume more energy when dealing with this difference in brightness and darkness, so our eyes can easily get tired when using a screen with uneven brightness.

Therefore, in order to solve the above problems, it is urgent to provide a new power signal transmission scheme to improve the brightness uniformity of the OLED display panel.

SUMMARY OF THE INVENTION

An object of the present invention is to provide a display panel that can significantly reduce the VDD voltage drop in the display panel, thereby improving the brightness uniformity of the display panel.

To achieve the above object, the present invention provides a display panel comprising a display area and a non-display area positioned at a periphery of the display area; and a driving chip disposed in the non-display area;

wherein the display area comprises a lower display area, a middle display area, and an upper display area that are gradually away from the driving chip;

wherein the display panel comprises a base substrate, a plurality of pixel units arranged in a matrix disposed on the base substrate, and a power signal structure configured to provide VDD power signals for each of the pixel units;

wherein the power signal structure comprises a VDD power cable electrically connected to the driving chip in the non-display area, a plurality of vertical VDD signal lines electrically connected to each of the pixel units between the pixel units, and a VDD lead-in portion electrically connected to the VDD power cable and the VDD signal lines;

wherein the driving chip is configured to supply the VDD power signals to each of the pixel units through a path formed by the VDD power cable, the VDD lead-in portion, and the VDD signal lines; and wherein the power signal structure comprises an insulating layer disposed between the VDD lead-in portion and the VDD signal lines, the VDD lead-in portion is insulated from each of the VDD signal lines by the insulating layer in the lower display area, and the VDD lead-in portion is electrically connected to each of the VDD signal lines through holes provided in the insulated layer in the middle display area.

The VDD lead-in portion comprises a plurality of VDD longitudinal lead-in lines disposed corresponding to the VDD signal lines.

Each of the VDD longitudinal lead-in lines extends from an end of the each of the VDD longitudinal lead-in lines which is electrically connected to the VDD power cable to the middle display area.

The VDD lead-in portion is a mesh structure comprising a plurality of VDD longitudinal lead-in lines and a plurality of VDD lateral lead-in lines perpendicularly intersecting the VDD longitudinal lead-in lines.

Each of the VDD longitudinal lead-in lines extends from an end of the each of the VDD longitudinal lead-in lines which is electrically connected to the VDD power cable to an upper side edge of the upper display area; and the VDD lead-in portion is electrically connected to each of the VDD signal lines in the upper display area through the holes provided in the insulating layer.

The VDD lead-in portion is a full-surface structure.

The display panel is an organic light emitting diode (OLED) display panel.

Each of the pixel units comprises an OLED device and a thin film transistor configured to drive the OLED device;

the thin film transistor comprises a source electrode and a drain electrode, and the OLED device comprises an anode electrically connected to the source electrode and the drain electrode; and the anode is electrically connected to the source electrode and the drain electrode through the holes in the insulating layer.

The VDD signal lines are disposed in the same layer as the source electrode and the drain electrode, and belong to a first source/drain electrode metal layer; and the VDD lead-in portion belongs to a second source/drain electrode metal layer provided on the insulating layer.

The VDD lead-in portion is disposed in the same layer as the source electrode and the drain electrode, and belongs to a first source/drain electrode metal layer; and the VDD signal lines belong to a second source/drain electrode metal layer disposed on the insulating layer.

The beneficial effects of the invention: The display panel of the present invention including a display area and a non-display area. A driving chip is disposed in the non-display area. The display area includes a lower display area, a middle display area, and an upper display area that are gradually away from the driving chip. The display panel comprises a base substrate, a plurality of pixel units, and a power signal structure. The power signal structure includes a VDD power cable electrically connected to the driving chip in the non-display area, a plurality of vertical VDD signal lines electrically connected to each of the pixel units between the pixel units, and a VDD lead-in portion electrically connected to the VDD power cable and the VDD signal lines. The VDD lead-in portion is electrically connected to each of the VDD signal lines through the holes provided in the insulated layer in the middle display area. Therefore, the VDD power signals provided by the driving chip is introduced from the middle display area, and then transmitted from the middle display area to each pixel units by the VDD signal lines, which can effectively reduce the VDD voltage drop in the OLED panel, thereby significantly improving the brightness uniformity of the OLED panel.

In order to further understand the features and technical details of the present invention, please refer to the following detailed description and drawings regarding the present invention. The drawings are provided for reference and description only and are not intended to limit the present invention.

BRIEF DESCRIPTION OF THE SEVERAL VIEWS OF THE DRAWINGS

The technical solutions and other advantageous effects of the present invention will be apparent from the following detailed description of embodiments of the invention.

In the drawings.

DESCRIPTION OF SPECIFIC EMBODIMENTS OF THE INVENTION

In order to further clarify the technical means and effects of the present invention, the following detailed description will be made in conjunction with the preferred embodiments of the invention and the accompanying drawings.

Figure 1:
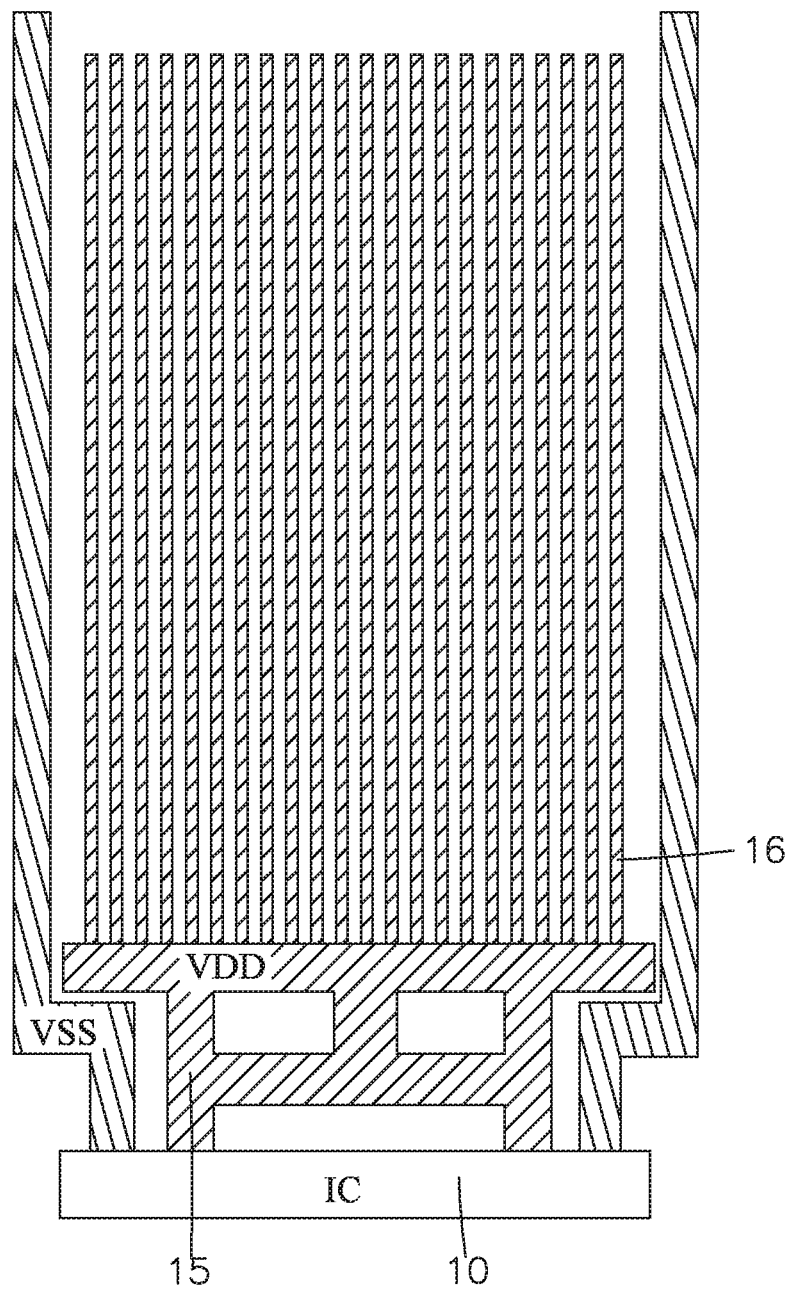
FIG. 1 is a schematic view of a power supply configuration of an existing organic light emitting diode (OLED) display panel.
Figure 2:
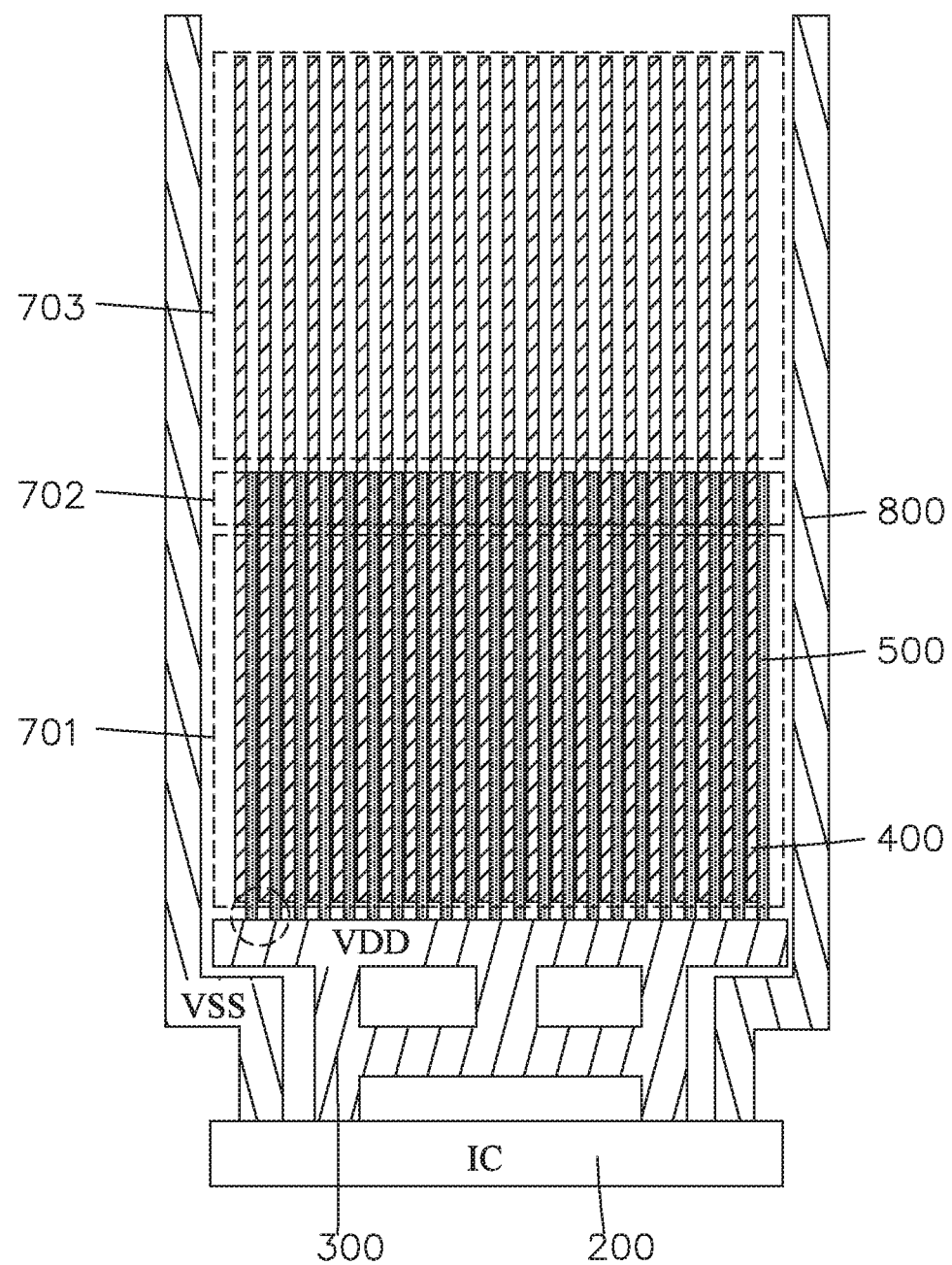
FIG. 2 is a schematic plan view showing a power signal structure of the display panel of a first embodiment of the present invention.

The present invention provides a display panel. Referring to FIG. 2, the display panel of a first embodiment of the present invention includes a display area at the middle portion and a non-display area at a periphery of the display area.

Specifically, the non-display area is provided with a driving chip 200.

Specifically, the display area includes a lower display area 701, a middle display area 702, and an upper display area 703 that are longitudinally arranged away from the driving chip 200.

Specifically, the display panel includes a base substrate 100, a plurality of pixel units (not shown) arranged in a matrix on the display substrate 100, and a power signal structure configured to provide VDD power signals for each of the pixel units.

Specifically, the power signal structure comprises a VDD power cable 300 electrically connected to the driving chip 200 in the non-display area, a plurality of vertical VDD signal lines 400 electrically connected to each of the pixel units between the pixel units, and a VDD lead-in portion 500 electrically connected to the VDD power cable 400 and the VDD signal lines 300.

Specifically, the driving chip 200 is configured to supply the VDD power signals to each of the pixel units through a path formed by the VDD power cable 300, the VDD lead-in portion 500, and the VDD signal lines 400.

Figure 3:
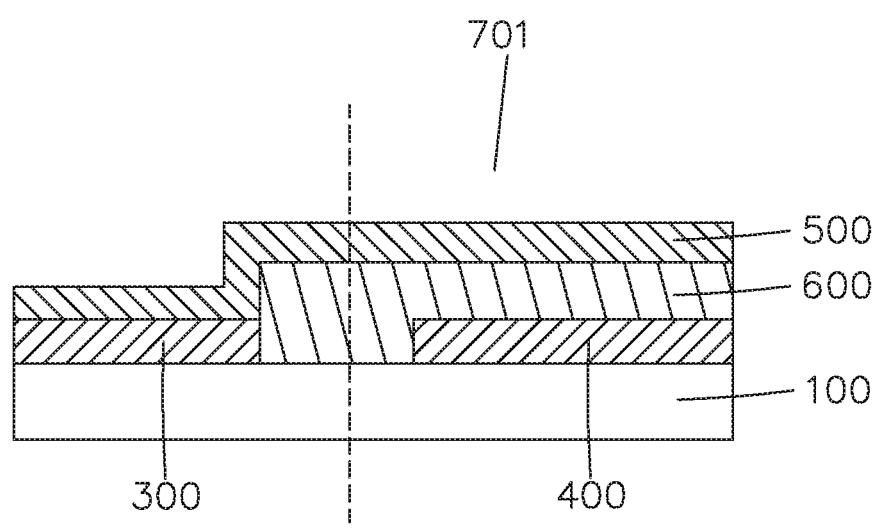
FIG. 3 is a schematic cross-sectional structural view of the circle in FIG. 2.

Specifically, as shown in FIG. 3, an insulating layer 600 is disposed between the VDD lead-in portion 500 and the VDD signal lines 400. The VDD lead-in portion 500 is insulated from each of the VDD signal lines 400 by the insulating layer 600 in the lower display area 701, and the VDD lead-in portion 500 is electrically connected to each of the VDD signal lines 400 through holes provided in the insulated layer 600 in the middle display area, and thus each of the VDD signal lines 400 transmits a VDD power signal from the middle portion to the both two sides.

Specifically, the VDD lead-in portion 500 comprises a plurality of VDD longitudinal lead-in disposed corresponding to the VDD signal lines 400.

Specifically, each of the VDD longitudinal lead-in lines extends from an end of the each of the VDD longitudinal lead-in lines which is electrically connected to the VDD power cable 300 to the middle display area 702. Each two ends of each of the VDD longitudinal lead-in lines is electrically connected to the VDD power line 300 and VDD signal lines 400.

Specifically, the display panel is an organic light emitting diode (OLED) display panel.

Specifically, each of the pixel units includes an OLED device and a thin film transistor for driving the OLED device.

Specifically, the thin film transistor includes an active layer, a gate, a source electrode, and a drain electrode, and the like. The OLED device includes an anode electrically connected to the source electrode and the drain electrode, an organic light emitting functional layer disposed on the anode, and a cathode disposed on the organic light emitting functional layer.

Specifically, the anode of the OLED device is electrically connected to the source electrode and drain electrode of the corresponding thin film transistor through the holes in the insulating layer 600.

Specifically, the VDD signal lines 400 are disposed in the same layer as the source electrode and drain electrode, and belong to a first source/drain electrode metal layer. The first source and drain electrode metal layers are further provided with a plurality of data lines parallel to the VDD signal lines 400 (not shown).

Specifically, the VDD lead-in portion 500 belongs to a second source/drain electrode metal layer disposed on the insulating layer.

Specifically, the middle display area 702 may be disposed at a middle position of the display panel, or may be disposed at other positions in the middle of the display panel, and the optimal position thereof may be given by an optimized calculation.

Specifically, the power signal structure further includes a VSS power line 800 electrically connected to the driving chip 200 on both sides of the display area to provide a VSS power signal to each of the pixel units.

In the first embodiment of the display panel of the present invention, the VDD power supply signal supplied from the driving chip 200 is introduced from the middle display area 702 through the VDD lead-in portion 500, and then transmitted from the middle display area 702 to the lower side display area 701 and the upper side display area 703 of the both sides by the VDD signal lines 400. The VDD voltage drops of the upper and lower sides of the display area are substantially the same, and the VDD voltage drop can be reduced to less than half of that of the conventional existing panel, thereby significantly improving the brightness uniformity of the panel.

Figure 4:
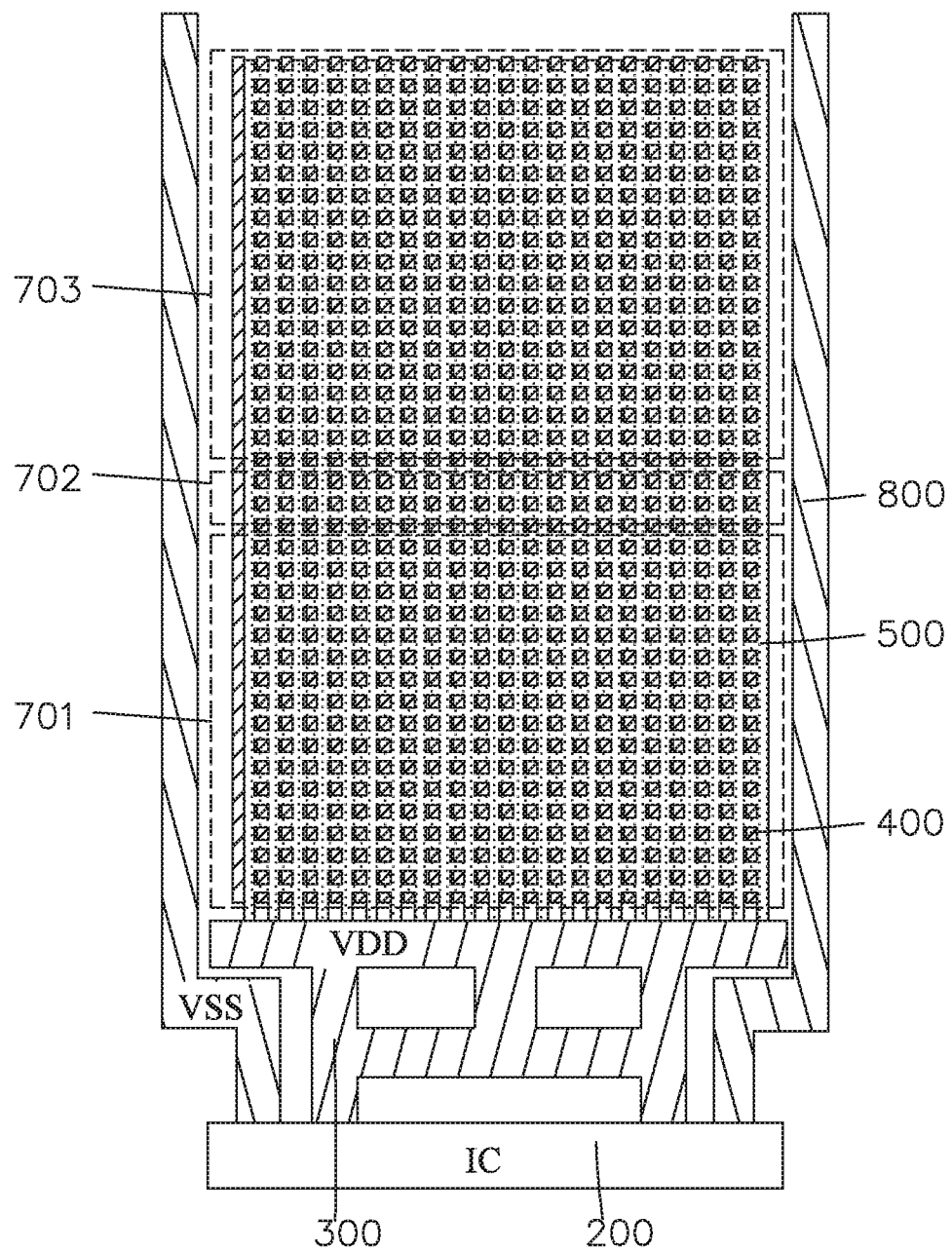
FIG. 4 is a schematic plan view showing a power signal structure of the display panel of a second embodiment of the present invention.

Referring to FIG. 4, FIG. 4 is a schematic plan view showing a structure of a power supply signal of the display panel of a second embodiment of the present invention. The difference between the present embodiment and the first embodiment is that the VDD lead-in portion 500 is a mesh structure, which further includes a plurality of VDD lateral lead-in lines perpendicularly intersecting the VDD longitudinal lead-in lines. That is, the VDD lead-in portion 500 has a larger area than the first embodiment, and the resistance of the VDD is smaller.

Specifically, in this embodiment, the VDD lead-in portion 500 covers the whole display area, and each of the VDD longitudinal lead-in wires extends from an end electrically connected to the VDD power supply line to an upper edge of the upper display area.

Further, the VDD lead-in portion 500 is further electrically connected to each of the VDD signal lines 400 in the upper display area 703 through the holes provided in the insulating layer 600, so that the VDD voltage drop of the upper display area 703 can be further reduced. At this time, because the VDD voltage drop trend of the upper display area 703 and the lower display area 701 is different, the middle display area 702 can be moved down by simulation optimization, and the current of the upper display area 703 can be made to coincide with the current of the lower display area 701, and the brightness uniformity of the display panel can also be improved.

Specifically, the specific position of the middle display area 702 can be made according to the consistent downward trends, which are respectively formed by the lower display area 701 in accordance with the VDD falling trend of the single metal trace and the upper display area 703 in accordance with the VDD falling trend of the double metal trace. At this time, the VDD voltage drop at the top and bottom of the display area is basically the same, the brightness uniformity can be optimized, and the brightness uniformity can reach 97%. Other technical features are the same as those in the first embodiment described above, and are not described herein again.

In the second embodiment of the display panel of the present invention, the VDD power supply signal supplied from the driving chip 200 is introduced from the middle display area 702 through the VDD lead-in portion 500, the VDD lead-in portion 500 is disposed in a mesh structure and is electrically connected to each of the VDD signal lines 400 in the upper display area 703 through the holes disposed at the insulating layer 600. This can further reduce the VDD voltage drop of the upper display area 703, so that the VDD voltage drops of the upper and lower portions of the display area are substantially the same, thereby significantly increasing the brightness uniformity of the panel.

Figure 5:
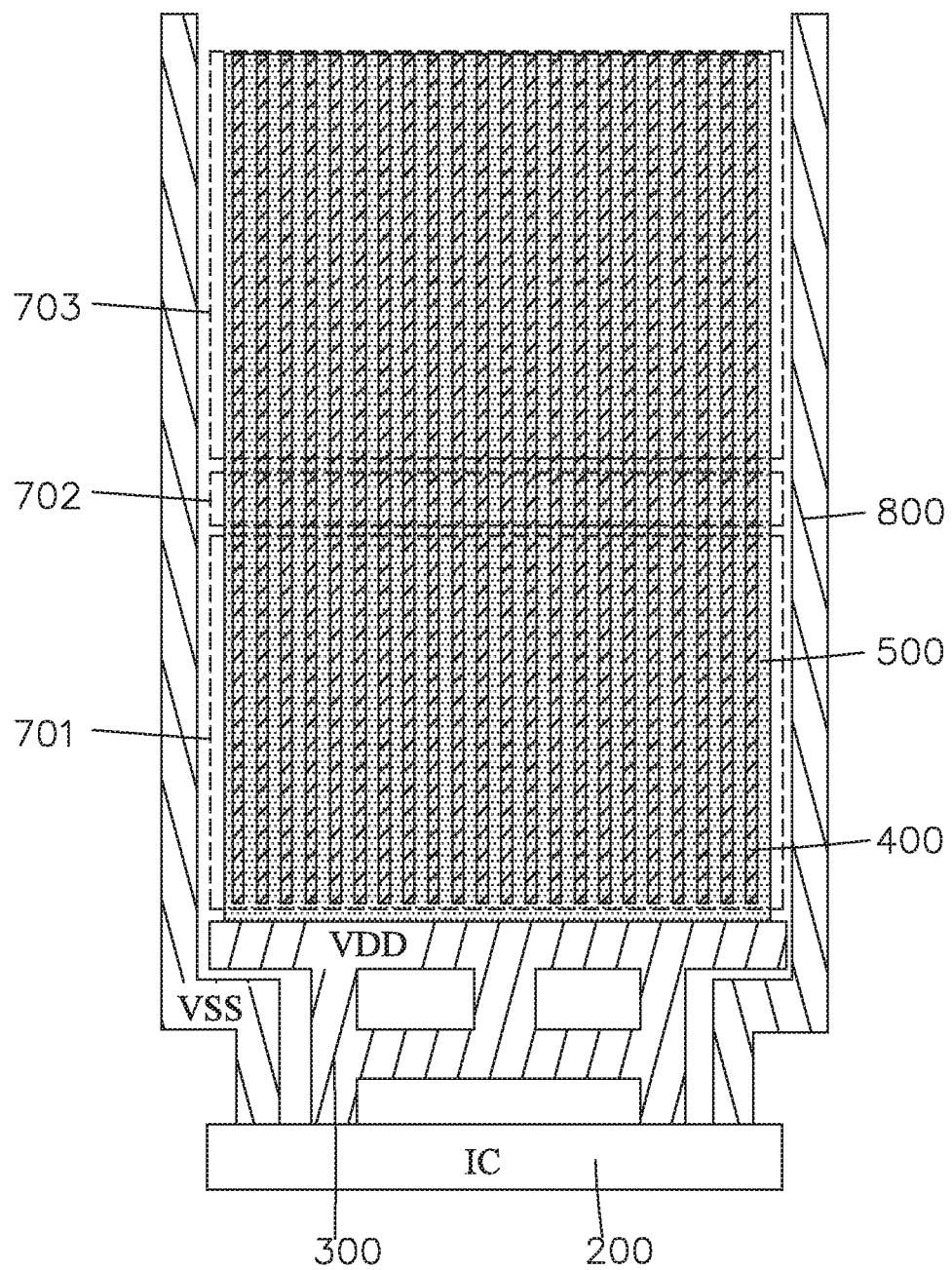
FIG. 5 is a schematic plan view showing a power signal structure of the display panel of a third embodiment of the present invention.

Referring to FIG. 5, FIG. 5 is a schematic plan view showing a power signal structure of the display panel of a third embodiment of the present invention. The difference between the present embodiment and the first embodiment is that the VDD lead-in portion 500 is a whole-surface structure, and the entire surface covers the display area, so it has smaller resistance, which can further improve the brightness uniformity of the display panel.

Specifically, in the embodiment, the VDD lead-in portion 500 needs to be repelled at the electrical connection position between the anode of the OLED device and the source electrode and drain electrode of the corresponding thin film transistor. That is, the holes are made here, so that the anode and the source electrode and drain electrode can be electrically connected. Other technical features are the same as those of the first embodiment described above, and are not described herein again.

In the third embodiment of the display panel of the present invention, the VDD power supply signal provided by the driving chip 200 is introduced from the middle display area 702 through the VDD lead-in portion 500, so that the VDD voltage drops of the upper and lower portions of the display area are substantially the same, thereby significantly increasing the brightness uniformity of the panel. The VDD lead-in portion 500 is provided with a full-surface structure, which can further improve the brightness uniformity of the display panel.

In the fourth embodiment of the display panel of the present invention, compared with the first embodiment, the difference is that the VDD lead-in portion 500 is disposed in the same layer as the source electrode and drain electrode of the thin film transistor, and belongs to the first source and drain electrode layer, and the VDD signal lines belong to a second source/drain electrode layer disposed on the insulating layer. Other technical features are the same as those of the first embodiment described above, and are not described herein again.

In the fourth embodiment of the display panel of the present invention, the VDD power supply signal supplied from the driving chip 200 is introduced from the middle display area 702 through the VDD lead-in portion 500, and then transmitted from the middle display area 702 to the lower side display area 701 and the upper side display area 703 of the both sides by the VDD signal lines 400. The VDD voltage drops of the upper and lower portions of the display area are substantially the same, and the VDD voltage drop can be reduced to less than half of that of the conventional existing panel, thereby significantly improving the brightness uniformity of the panel.

In summary, the display panel of the present invention includes a display area and a non-display area. A driving chip is disposed in the non-display area. The display area includes a lower display area, a middle display area, and an upper display area that are gradually away from the driving chip. The display panel comprises a base substrate, a plurality of pixel units, and a power signal structure. The power signal structure includes a VDD power cable electrically connected to the driving chip in the non-display area, a plurality of vertical VDD signal lines electrically connected to each of the pixel units between the pixel units, and a VDD lead-in portion electrically connected to the VDD power cable and the VDD signal lines. The VDD lead-in portion is electrically connected to each of the VDD signal lines through holes provided in the insulated layer in the middle display area. Therefore, the VDD power signals provided by the driving chip is introduced from the middle display area, and then transmitted from the middle display area to each of the pixel units by the VDD signal lines, which can effectively reduce the VDD voltage drop in the OLED panel, thereby significantly improving the brightness uniformity of the OLED panel.

In the above, various other corresponding changes and modifications can be made according to the technical solutions and technical ideas of the present invention to those skilled in the art, and all such changes and modifications are within the scope of the claims of the present invention.

What is claimed is:

1. A display panel, comprising a display area and a non-display area positioned at a periphery of the display area; and
   a driving chip disposed in the non-display area;
   wherein the display area comprises a lower display area, a middle display area, and an upper display area that are gradually away from the driving chip;
   wherein the display panel further comprises a base substrate, a plurality of pixel units arranged in a matrix disposed on the base substrate, and a power signal structure providing VDD power signals for each of the pixel units;
   wherein the power signal structure comprises a VDD power cable disposed in a lower position of the non-display area and electrically connected to the driving chip, a plurality of vertical VDD signal lines disposed among the pixel units and electrically connected to each of the pixel units, and a VDD lead-in portion electrically connecting the VDD power cable to the VDD signal lines;
   wherein the VDD lead-in portion is a mesh structure comprising a plurality of VDD longitudinal lead-in lines and a plurality of VDD lateral lead-in lines perpendicularly intersecting the VDD longitudinal lead-in lines;
   wherein the driving chip supplies the VDD power signals to each of the pixel units through a path formed by the VDD power cable, the VDD lead-in portion, and the VDD signal lines; and
   wherein the power signal structure further comprises an insulating layer disposed between the VDD lead-in portion and the VDD signal lines, the VDD lead-in portion is insulated from each of the VDD signal lines by the insulating layer in the lower display area, and the VDD lead-in portion is electrically connected to each of the VDD signal lines through via-holes defined on the insulated layer in the middle display area.

2. The display panel as claimed in claim 1, wherein the VDD longitudinal lead-in lines are disposed corresponding to the VDD signal lines.

3. The display panel as claimed in claim 2, wherein each of the VDD longitudinal lead-in lines extends from an end of each of the VDD longitudinal lead-in lines which is electrically connected to the VDD power cable to the middle display area.

4. The display panel as claimed in claim 1, wherein each of the VDD longitudinal lead-in lines extends from an end of each of the VDD longitudinal lead-in lines which is electrically connected to the VDD power cable to an edge of an upper side of the upper display area; and
   the VDD lead-in portion is electrically connected to each of the VDD signal lines in the upper display area through the via-holes defined on the insulating layer.

5. The display panel as claimed in claim 1, wherein the VDD lead-in portion is a whole-surface structure.

6. The display panel as claimed in claim 1, wherein the display panel is an organic light-emitting diode (OLED) display panel.

7. The display panel as claimed in claim 6, wherein each of the pixel units comprises an OLED device and a thin film transistor driving the OLED device;
   the thin film transistor comprises a source electrode and a drain electrode, and the OLED device comprises an anode electrically connected to the source electrode and the drain electrode; and
   the anode is electrically connected to the source electrode and the drain electrode through the via-holes defined on the insulating layer.

8. The display panel as claimed in claim 7, wherein the VDD signal lines are disposed in a same layer as the source electrode and the drain electrode, and belong to a first source/drain electrode metal layer; and
   the VDD lead-in portion belongs to a second source/drain electrode metal layer provided on the insulating layer.

9. The display panel as claimed in claim 7, wherein the VDD lead-in portion is disposed in a same layer as the source electrode and the drain electrode, and belongs to a first source/drain electrode metal layer; and
   the VDD signal lines belong to a second source/drain electrode metal layer disposed on the insulating layer.

* * * * *